United States Patent
Ruppi

[11] Patent Number: 6,015,614
[45] Date of Patent: Jan. 18, 2000

[54] CEMENTED CARBIDE BODY WITH HIGH WEAR RESISTANCE AND EXTRA TOUGH BEHAVIOR

[75] Inventor: Sakari Ruppi, Fagersta, Sweden

[73] Assignee: Seco Tools AB, Fagersta, Sweden

[21] Appl. No.: 08/962,684

[22] Filed: Nov. 3, 1997

[51] Int. Cl.[7] .................................................. C23C 16/30
[52] U.S. Cl. ......................... 428/335; 428/334; 428/469; 428/472; 428/698; 428/701; 428/702; 407/119; 408/1 R
[58] Field of Search ..................................... 428/216, 336, 428/701, 702, 698, 335, 334, 472, 469; 407/119; 408/1 R

[56] References Cited

U.S. PATENT DOCUMENTS

| | | |
|---|---|---|
| 4,984,940 | 1/1991 | Bryant et al. . |
| 5,071,696 | 12/1991 | Chatfield ................................. 428/220 |
| 5,137,774 | 8/1992 | Ruppi . |
| 5,162,147 | 11/1992 | Ruppi ..................................... 428/216 |
| 5,188,489 | 2/1993 | Santhanam et al. .................... 407/119 |
| 5,487,625 | 1/1996 | Ljungberg et al. ..................... 428/698 |
| 5,545,490 | 8/1996 | Oshika .................................... 428/698 |
| 5,597,272 | 1/1997 | Moriguchi et al. . |
| 5,635,247 | 6/1997 | Ruppi . |
| 5,674,564 | 10/1997 | Ljungberg et al. .................. 427/255.2 |
| 5,705,263 | 1/1998 | Lenander et al. ........................ 428/216 |
| 5,766,782 | 6/1998 | Ljungberg et al. ..................... 428/698 |
| 5,786,069 | 7/1998 | Ljungberg et al. ..................... 428/216 |
| 5,861,210 | 1/1999 | Lenander et al. ....................... 428/336 |

FOREIGN PATENT DOCUMENTS 0732 423 A1    9/1996    European Pat. Off. .

*Primary Examiner*—Archene Turner
*Attorney, Agent, or Firm*—Burns, Doane, Swecker & Mathis, L.L.P.

[57] ABSTRACT

There is provided an $Al_2O_3$-TiN coated cemented carbide insert intended for turning of steels and especially Ca-treated steels. The alumina layer is protected by an extra thick and multilayered coating of TiN. The TiN coating is wet blasted and, for this purpose, (Ti,Al)(C,O,N) bonded to the underlying $Al_2O_3$ layer which preferably consists of $\alpha$-$Al_2O_3$. The extra tough behavior together with increased wear resistance can be obtained by optimizing the TiN layer thickness, structure and adhesion and wet blasting the said TiN coating. This invention is characterized by the fact that the coating layers are not missing at the cutting edge of the insert.

10 Claims, 5 Drawing Sheets

SINGLE TiN LAYER

SEM

MULTI TiN LAYERS

SEM

MULTI TiN LAYERS WITH BONDING LAYER

SEM

CEMENTED CARBIDE BODY WITH HIGH WEAR RESISTANCE AND EXTRA TOUGH BEHAVIOR

BACKGROUND OF THE INVENTION

Aluminum oxide coated cemented carbide cutting tools have been in industrial practice for well over 15 years and are today commonly used for the turning and milling of cast irons and steels.

$Al_2O_3$ coatings are usually deposited by chemical vapor deposition (CVD) after applying an intermediate layer of TiC, TiN or Ti(C,N), either as a single layer or as multilayers onto the cemented carbide substrate. Instead of using intermediate layers, the cemented carbide substrate can be enriched with γ-carbide phase, i.e., a solid solution of cubic carbides of titanium, tantalum, niobium and tungsten, prior to $Al_2O_3$ deposition. In order to enhance adhesion of alumina to the intermediate layer, one or several interlayers, usually referred to as bonding layers, can be applied between the intermediate layer and the alumina layer. Furthermore, the alumina coating itself may be deposited as multilayers. Accordingly, a plurality of coating combinations exist.

The CVD alumina layers are usually composed of pure $κ-Al_2O_3$, mixtures of $κ-Al_2O_3$ and $α-Al_2O_3$ or pure $α-Al_2O_3$. A layer of TiN is usually deposited on top to the alumina layer. The TiN layer is usually relatively thin (1 to 2 μm) and is mainly used to give the tool an attractive appearance—the so-called "golden color". For example, the TiN layer, which is referred to as a finish layer in U.S. Pat. No. 4,984,940, is used to provide a low friction surface and to minimize metal build-up on the coating. Accordingly, the TiN in this case is relatively thin, about or less than 2 μm and much less than 4 μm, although it is disclosed in this patent to be 0.2–4 μm.

In addition to the golden colored alumina coated inserts, black inserts, i.e., alumina coating without the TiN top coat, are present in the marketplace and have, in fact, gained great industrial success. These inserts are often wet blasted in order to enhance the chipping resistance and surface finish. It has earlier been assumed that wet blasting must be performed directly on the alumina coating for two main reasons:

1) The TiN layer deposited on top of the alumina layer is assumed to deteriorate the wet blasting effect; and 2) Wet blasting of TiN coated alumina inserts cannot be controlled in production scale due to the poor adhesion between TiN and alumina. For this reason, there have not been any wet blasted TiN coated or $Al_2O_3$-TiN coated inserts on the market.

Consequently, the TiN coated alumina inserts are usually brushed in order to enhance the chipping resistance and edge strength. Brushing of the TiN coated (golden colored) alumina inserts results in a black line along the cutting edge (area where the TiN layer is worn away).

OBJECTS AND SUMMARY OF THE INVENTION

It is an object of this invention to avoid or alleviate the problems of the prior art.

It is further an object of this invention to provide a $Al_2O_3$ coated cemented carbide cutting tool with high wear resistance and extra tough behavior.

In one aspect of the invention there is provided a coated cemented carbide body comprising a substrate of a cemented carbide, a layer of $Al_2O_3$ and an outer layer of wet blasted TiN at least 4 μm in thickness.

In another aspect of the invention there is provided a method of cutting Ca-treated steels using a cemented carbide cutting insert, the improvement comprising using a cutting insert of a coated cemented carbide body comprising a substrate of a cemented carbide, a layer of $Al_2O_3$ and an outer layer of wet blasted TiN at least 4 μm in thickness.

DETAILED DESCRIPTION OF THE PREFERRED EMBODIMENTS OF THE INVENTION

It has been found that a thick ($\geq 4$ μm) layer of TiN deposited on top of the alumina layer improves the cutting performance of the insert by several hundred percent over prior art products in steels. An especially pronounced effect can be obtained in Ca-treated steels. Flank wear resistance can especially be improved.

It has also been found that wet blasting can be performed on the TiN layer without sacrificing the chipping resistance. For this purpose, the adhesion of the TiN layer has to be enhanced and the TiN layer itself has to be multilayered.

Figure 1A:
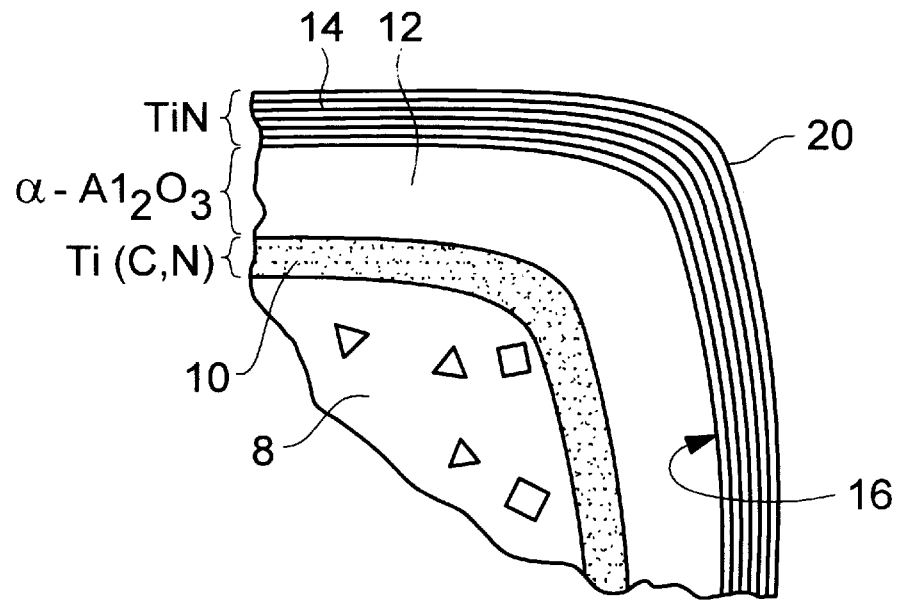
FIG. 1a is a representation of one embodiment of the invention relating to the deposition of the alumina layer as described below.
Figure 1B:
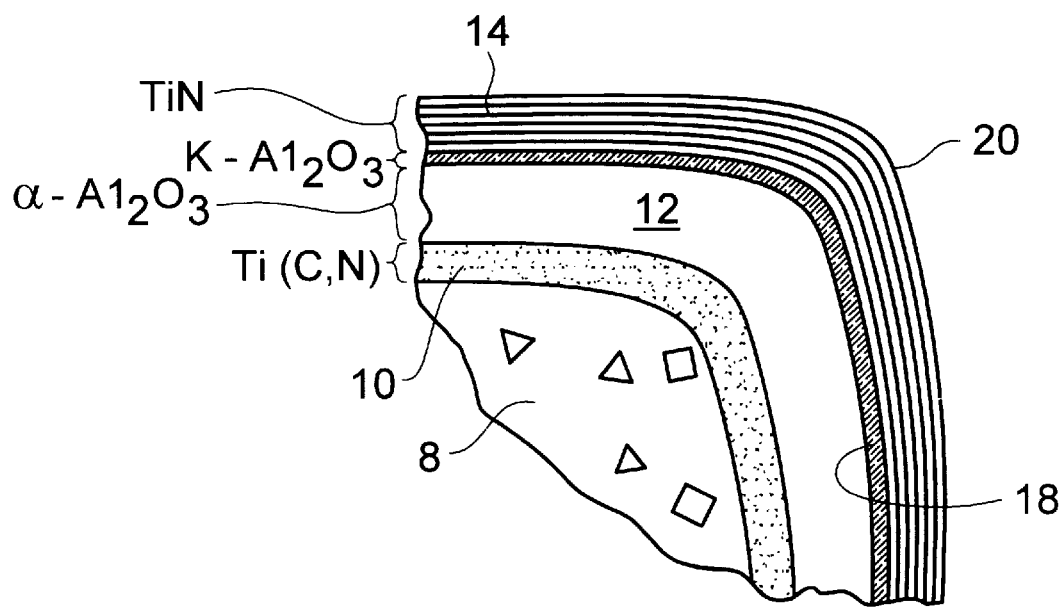
FIG. 1b is a representation of a second embodiment of the invention relating to the deposition of the alumina layer as described below.
Figure 1C:
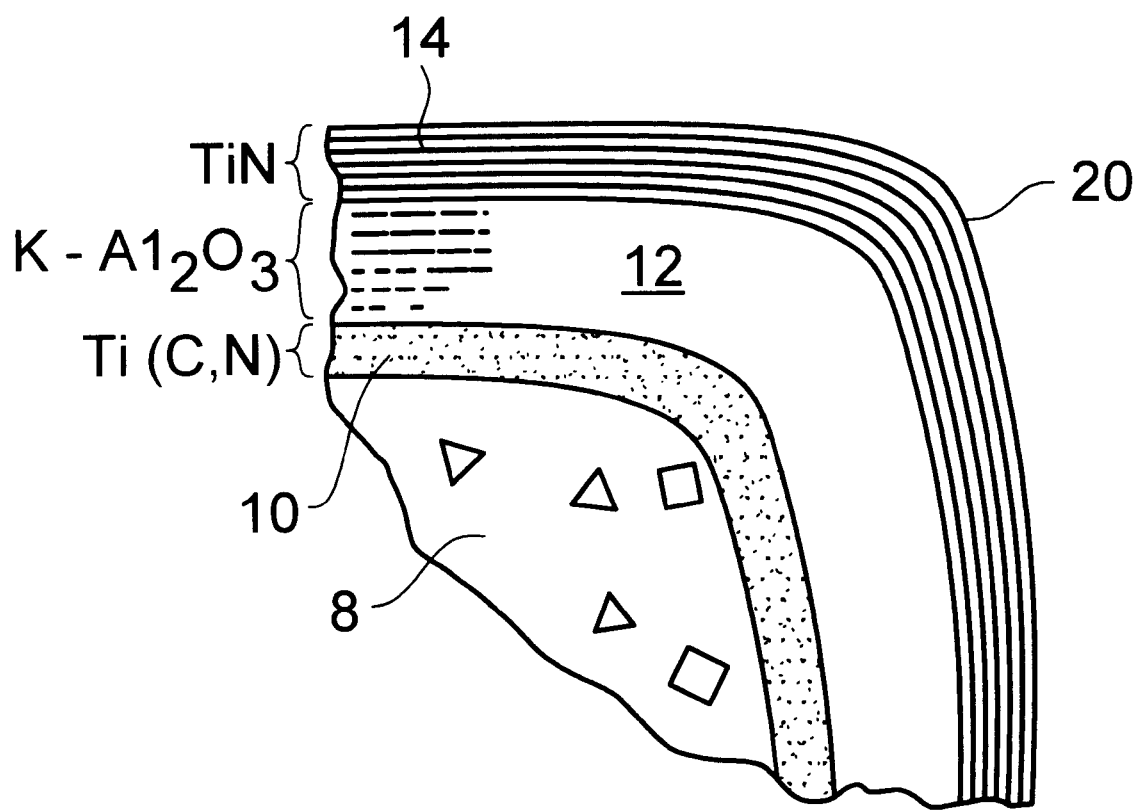
FIG. 1c is a representation of a third embodiment of the invention relating to the deposition of the alumina layer as described below.

According to the present invention, a multilayered, coated cemented carbide is provided. As shown in FIGS. 1a, 1b and 1c, the coating is composed of three main layers:

1) an inner layer 10 of Ti(C,N) with a thickness of at least 4 μm;

2) an intermediate layer 12 of $Al_2O_3$ with a thickness of at least 6 μm; and 3) an outer layer 14 of a TiN/TiC multilayer with a thickness of at least 4 μm, preferably greater than 4 μm.

This TiN/TiC multilayer is characterized as a relatively thick multilayer of mainly TiN applied on top of a thick alumina layer. It has been found to be important to combine the positive effects of TiN and $Al_2O_3$ in this way, i.e., the alumina layer is not alone considered as an "active" layer and the TiN layer is not deposited as a "finish" layer.

As shown in the Example below, this product shows a superior performance in the cutting of steels compared with prior art products. The TiN/TiC multilayer is especially important when Ca-treated steels are the material to be cut. The alumina layer underneath the TiN/TiC multilayer is also important as a thermal barrier reducing plastic deformation at higher cutting speeds.

The inner layer 10 is deposited directly on the cemented carbide substrate 8, the inner layer being at least one layer of TiC, Ti(C,N), TiN, Ti(C,O) or Ti(C,O,N). This layer is preferably Ti(C,O,N) and Ti(C,N) with thin intermediate layers of TiC or TiN being inserted in this layer in order to prevent transport of cobalt to the Ti(C,N)-$Al_2O_3$ interface. The thickness of this layer is in the range of 4 to 10 μm, preferably from 5 to 6.5 μm.

The outer layer 14 is a multilayered TiN-TiC coating deposited on top of the intermediate layer 12 of aluminum oxide. This layer 14 must be multilayered in order to obtain grain refinement via renucleation. With a single TiN layer, relatively large TiN grains would otherwise develop resulting in poor wet blasting properties.

This outer layer is composed of 5–20 layers, preferably 6–10 layers, of TiN separated by thin, <0.01 μm, layers of Ti(C,N) or TiC, preferably of TiC. It has further been found to be advantageous to dope the TiN layers with carbon. For example, ≦1% $CH_y$ can be added to the reactive gasses during deposition of every second layer of TiN. Increased growth rate and further grain reinforcement can be obtained (FIG. 6).

The total thickness of the TiN multilayer is in the range of 4 to 15 μm, preferably in the range of 4 to 6 μm. The first multilayer can preferably be pure TiC instead of TiN when deposited on a (Ti,Al)(C,O,N) bonding layer on $\alpha$-$Al_2O_3$.

The intermediate layer is aluminum oxide. This alumina layer must be either pure (100%) $\alpha$-$Al_2O_3$ or pure (100%) $\kappa$-$Al_2O_3$. The purity of the phase of the alumina is important because the K-C phase transformation during deposition of the TiN multilayer would result in high stresses at the $Al_2O_3$-TiN interface and would consequently weaken the adhesion of the TiN layer. The thickness of the alumina layer should be in the range of 6 to 20 μm, preferably in the range of 8 to 12 μm. The alumina layer should preferably be composed of $\alpha$-$Al_2O_3$ due to its better performance in cast iron as disclosed in U.S. Pat. No. 5,137,774.

It has however, been found that TiN, TiC and Ti(C,N) exhibit a poor adhesion when deposited directly on an $\alpha$-$Al_2O_3$ layer and good adhesion when deposited directly on a $\kappa$-$Al_2O_3$ layer 18. Good adhesion between, for example, TiN and $\kappa$-$Al_2O_3$ is assumed to be due to epitaxy at this interface. For this reason, a special bonding layer 16 should be used when TiN or TiC is deposited on $\alpha$-$Al_2O_3$. The $\alpha$-$Al_2O_3$ can also be modified according to U.S. Pat. No. 5,137,774. Consequently, there are three main alternatives to deposit the alumina layer:

1) $\alpha$-$Al_2O_3$+[(Ti,Al)(C,O,N)/TiC]-bonding layer+multi TiN/TiC. (See FIG. 1a) The $\alpha$-$Al_2O_3$ is deposited as described in U.S. Pat. No. 5,137,774 or obtained as described in U.S. Pat. No. 5,635,247.

2) $\alpha$-$Al_2O_3$+(Ti,Al)(C,O) modification layer+$\kappa$-$Al_2O_3$+ multi TiN/TiC. (See FIG. 1b) The $\alpha$/$\kappa$ multioxide is deposited according to U.S. Pat. No. 5,137,774. The $\kappa$-$Al_2O_3$ on $\alpha$-$Al_2O_3$ should be in the range of 0.5–1.5 μm. A multilayer TiN/TiC coating can be deposited with sufficient adhesion onto this $\kappa$-$Al_2O_3$ layer.

3) $\kappa$-$Al_2O_3$+multi TiN/TiC. (See FIG. 1c) The $\kappa$-$Al_2O_3$ layer can be deposited as described in U.S. Pat. No. 5,137,774 or should preferably be composed of multilayers (8×$\kappa$-$Al_2O_3$) as described in U.S. Pat. No. 5,635,247. No bonding layer is needed.

The relatively long heat-treatment during deposition of the TiN multilayer may cause the $\kappa$-$\alpha$ transformation to occur. For this reason, alternative number 1 is preferred.

Wet blasting the outer surface 20 of the outer layer 14 was carried out with $Al_2O_3$ particles (320 mesh, medium grain size ˜30 μm) in water suspension. The applied pressure was 2–6 bar, preferably 3 bar. The inserts were rotated while wet blasted. Both sides of the inserts were wet blasted.

The invention is additionally illustrated in connection with the following Example which is to be considered as illustrative of the present invention. It should be understood, however, that the invention is not limited to the specific details of the Example.

EXAMPLE

The coating combinations described below are CVD deposited on commercial CNMG 120408-M3 cemented carbide inserts. The coating combinations are used to demonstrate the following:

the influence of the TiN layer deposited on top of the alumina layer for cutting performance in steel and cast iron (Series A, Table 1);

the influence of the $Al_2O_3$/TiN thickness ratio for the cutting performance in steel and cast iron (Series B, Table 2);

optimization of the toughness of these inserts using wet blasting; and optimization of the blasting response of the coated inserts (adhesion and the mechanical properties of the TiN layers, Series C, Table 3).

Figure 2:
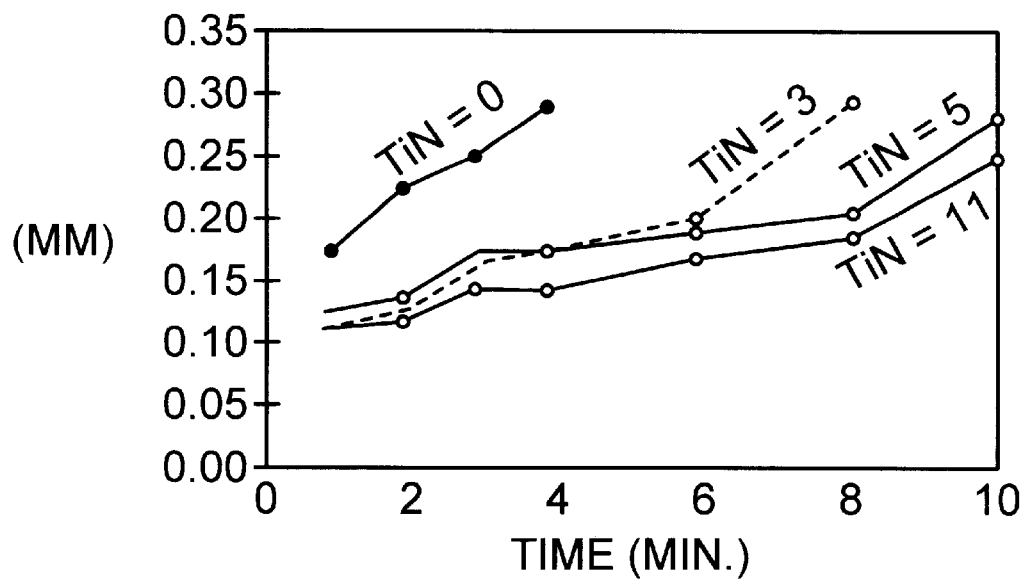
FIG. 2 is a graph of flank wear of an insert used to cut medium carbon steel.
Figure 3:
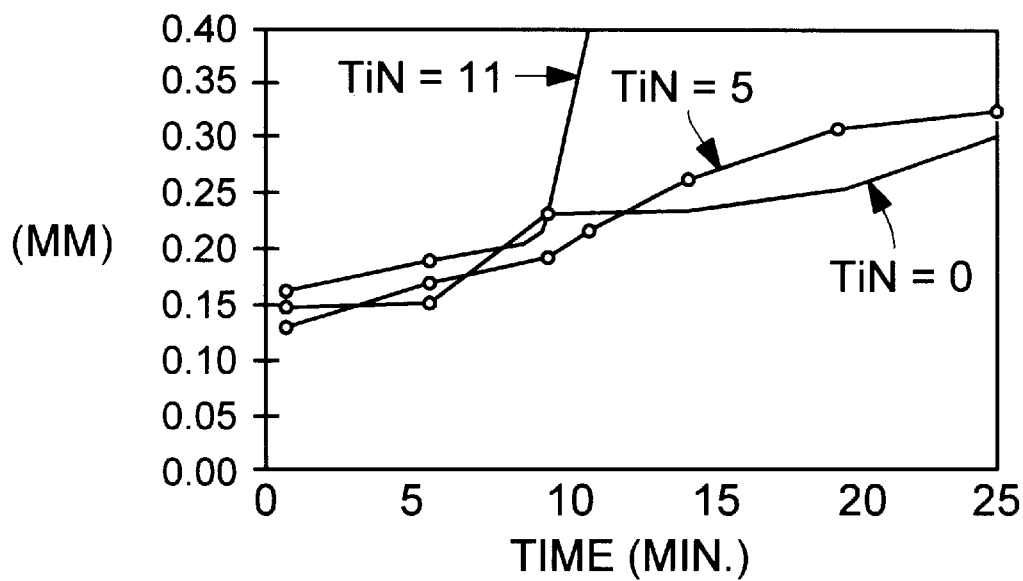
FIG. 3 is a graph of flank wear of an insert used to cut cast iron.

The cutting test results are shown for steel and cast iron in Tables 4 and 5, respectively. The failure mode of the TiN coated inserts is generally flank wear in steel and cast iron (FIGS. 2 and 3). Alumina layers without top TiN typically exhibited crater wear. As is clear from FIG. 4, the performance (lifetime) is strongly increased as a function of the TiN layer thickness up to about 8 μm in steel, and especially in Ca-treated steels. However, the cutting performance is found to deteriorate in cast iron when the TiN layer thickness exceeds 5 μm.

As the coating thickness increases, residual stresses are built up in the coatings. The residual stresses reduce the strength of the coatings and can be often seen as increased chipping tendency (brittleness) of the coated tools. The residual stresses can be decreased by wet blasting of the coated tools. The wet blasting reduces the chipping tendency drastically.

Figure 5:
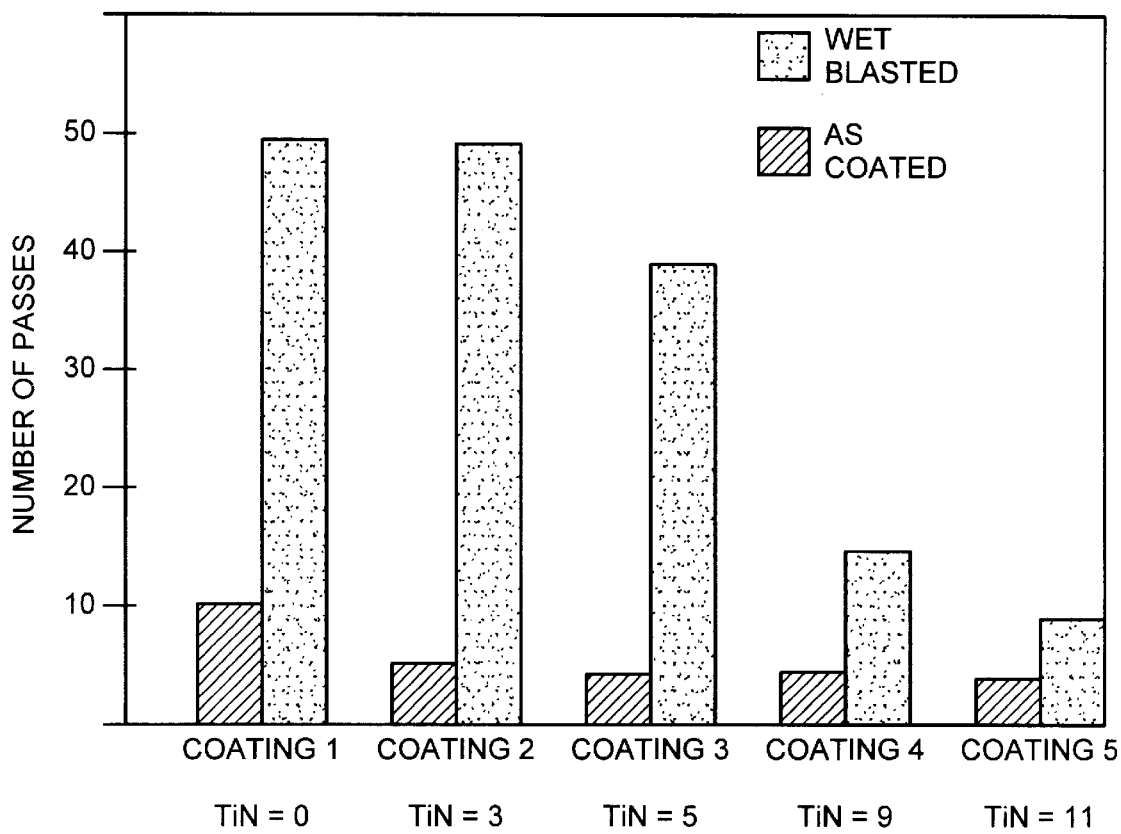
FIG. 5 is a graph of the number of passes obtained with certain inserts either as coated or wet blasted.

As shown in Table 6 and FIG. 5, the chipping resistance of the as-coated inserts is not sufficient. The wet blasting increases the chipping resistance of the TiN coated alumina coatings drastically, but again only to a certain TiN layer thickness. This is about 5 μm. Consequently, the thickness of the TiN layer must be limited to this thickness (about 5 μm) in order to obtain sufficient toughness (the 40 passes in the laboratory conditions have been found to correlate with sufficient toughness in the machine shops).

The alumina layer is important under the TiN layer when higher cutting speeds are concerned (Table 7). Although I do not wish to be bound by any specific theory, it is speculated that the alumina layer acts as a thermal barrier and consequently reduces plastic deformation of the inserts. At cutting speeds under 200 m/min, one could expect that the alumina coated inserts would perform no better than TiN coated inserts.

Figure 6A:
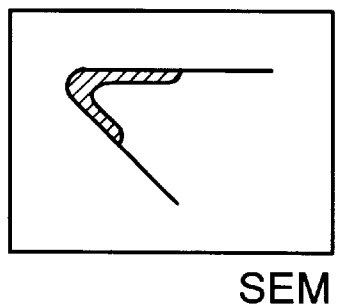
FIGS. 6a–6c are representations of typical SEM's (scanning electron microscopy) of certain inserts showing their response to blasting.
Figure 6B:
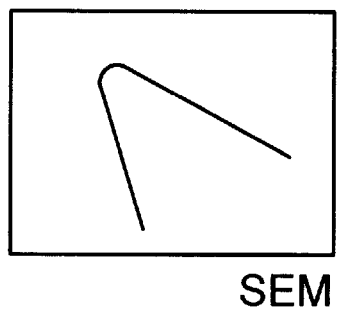
Figure 6C:
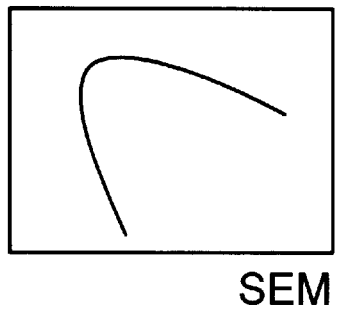

As pointed out above, blasting is of utmost importance when toughness is concerned. In production scale, it is impossible to obtain acceptable results with a single TiN layer (FIG. 6a). Better results are obtained with multi TiN layers (FIG. 6b) or a single TiN layer in combination with a (Ti,Al)(C,O,N) bonding layer. The only acceptable solution, however, is a multilayered TiN coating which is bonded to a $Al_2O_3$ layer via a (Ti,Al)(C,O,N) bonding layer, Table 8, FIG. 6c. It is emphasized here that the coating layers are not missing at the cutting edge as, for example, is the case with the prior art products (when TiN overlays $Al_2O_3$)(see, for example, U.S. Pat. No. 5,597,272). It is also noted that the cutting performance in steel was slightly increased when the TiN layer was multilayered and properly bonded to the alumina layer. In cast iron, failures through chipping and flaking at the coatings occurred when the thickness of the TiN layer exceeded 5 $\mu$m.

When machining modern Ca-treated steels, the cutting speeds can be substantially increased. However, the coating materials do not possess the same properties in these steels as compared to conventional steels. For example, $Al_2O_3$ is not necessarily the most stable coating material. It has been suggested that the elements present in the Ca-treated steels react with alumina to form a liquid with low melting temperature. This liquid is easily removed by the chip resulting in a large wear rate.

Figure 4:
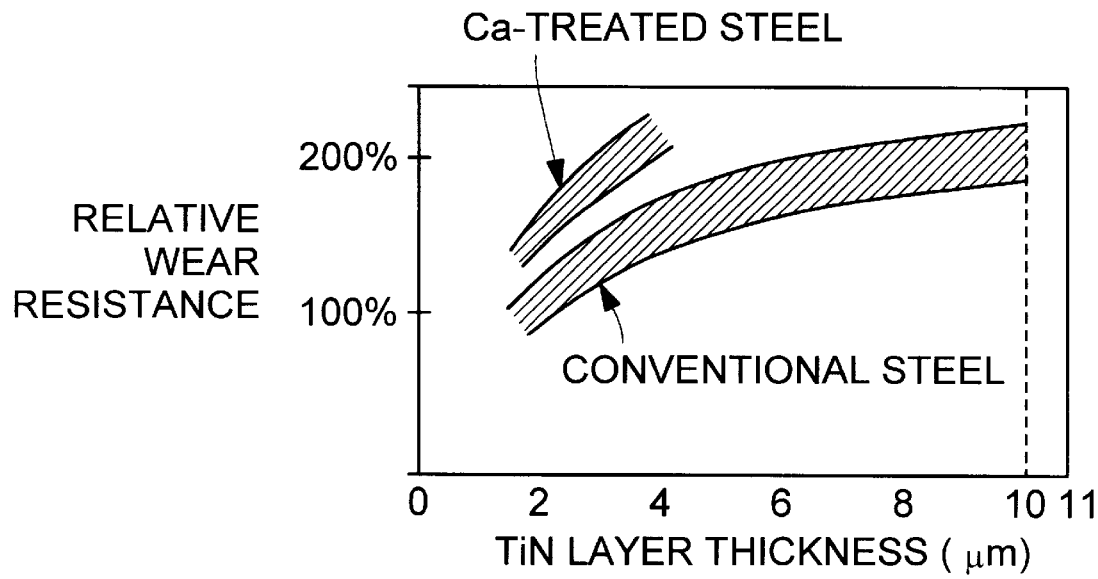
FIG. 4 is a graph of relative wear resistance vs. TiN layer thickness in tests involving different materials.

The present tests show that TiN and TiC coatings are much more effective with respect to crater wear resistance and flank wear resistance in Ca-treated steels than $Al_2O_3$ coatings. However, $Al_2O_3$ coatings are much more effective than TiC and TiN coatings with respect to notch wear resistance and obviously $Al_2O_3$ may act as a thermal barrier making the higher cutting speed possible. These tests also show that the most effective way to combine these positive effects to TiN/TiC and $Al_2O_3$ coatings is to deposit them as multilayers so that the TiN/TiC coating overlays the alumina coating (as shown above for conventional steel). An average increase in lifetime in Ca-treated steel is 50%–100% better than that obtained in conventional steels over the prior art products (FIG. 4).

TABLE 1

Coating Structures From Substrate Outwards (Series A)

| No. 1 | Ti(C, N) | 6 $\mu$m | |
| | $\alpha$-$Al_2O_3$ | 8 $\mu$m | |
| No. 2 | Ti(C, N) | 6 $\mu$m | |
| | $\alpha$-$Al_2O_3$ | 8 $\mu$m | |
| | TiN | 3 $\mu$m | |
| No. 3 | Ti(C, N) | 6 $\mu$m | |
| | $\alpha$-$Al_2O_3$ | 8 $\mu$m | |
| | TiN | 5 $\mu$m | $\Sigma$19 $\mu$m |
| No. 4 | Ti(C, N) | 6 $\mu$m | |
| | $\alpha$-$Al_2O_3$ | 8 $\mu$m | |
| | TiN | 9 $\mu$m | |
| No. 5 | Ti(C, N) | 6 $\mu$m | |
| | $\alpha$-$Al_2O_3$ | 8 $\mu$m | |
| | TiN | 11 $\mu$m | |

TABLE 2

Coating Structures From Substrate Outwards (Series B)

| No. 6 | Ti(C, N) | 6 $\mu$m | |
| | $Al_2O_3$ | 0 $\mu$m | |
| | TiN | 13 $\mu$m | $\Sigma$19 $\mu$m |
| No. 7 | Ti(C, N) | 6 $\mu$m | |
| | $Al_2O_3$ | 4 $\mu$m | |
| | TiN | 9 $\mu$m | $\Sigma$19 $\mu$m |

TABLE 3

Coating Structures (Series C)
(Used To Test Wet Blasting Response)

| No. 8 | Ti(C, N) | 6 $\mu$m |
| | $\alpha$-$Al_2O_3$ | 8 $\mu$m |
| | TiN | 5 $\mu$m (multi, composed of 6 layers of TiN separated by TiC layers) |
| No. 9 | Ti(C, N) | 6 $\mu$m |
| | $\alpha$-$Al_2O_3$ | 8 $\mu$m |
| | bonding | (Ti, Al)(C, O, N) $\leq$ 0.5 $\mu$m |
| | TiN | 5 $\mu$m (single) |
| No. 10 | Ti(C, N) | 6 $\mu$m |
| | $\alpha$-$Al_2O_3$ | 8 $\mu$m |
| | bonding | (Ti, Al)(C, O, N) $\leq$ 0.5 $\mu$m |
| | TiN | 5 $\mu$m (multi, as No. 8) |

TABLE 4

Tool Life and Failure Mode, Steel SS1672
(As-coated and Wet Blasted)

| Turning: | SS1672 |
| Cutting Speed: | 350 m/min$^{-1}$ |
| Feed: | 0.25 mm/r$^{-1}$ |
| Depth of Cut: | 2.5 mm |
| Coolant: | no |

| Coating | Failure Mode | Average Lifetime/mm*) |
| --- | --- | --- |
| No. 1 | crater wear | 4 |
| | flank wear | |
| No. 2 | flank wear | 7.5 |
| No. 3 | flank wear**) | 11 |
| Nos. 4 and 5 | flank wear**)***) | 12 |

*)note: Average Lifetime (when not determined by chipping) was slightly higher for wet blasted inserts
**)note: chipping observed in as-coated inserts
***)note: chipping observed in blasted inserts

TABLE 5

Tool Life and Failure Mode, Cast Iron SS0130
(Wet Blasted)

| Turning: | SS0130 |
| Cutting Speed: | 300 m/min |
| Feed: | 0.25 mm/r |
| Depth of Cut: 2.5 mm | |
| Insert Style: | CNMG 120408-M3 |
| Coolant: | no |

| Coating | Failure Mode | Average Lifetime/min |
| --- | --- | --- |
| No. 1 | flank wear (uniform) | 25 |
| No. 2 | flank wear (uniform) | 25 |
| No. 3 | flank wear (uniform) | 22 |
| No. 4 | flank wear*) (localized) | 11 |
| No. 5 | flank wear*) (localized) | 10 |

*)note: flaking of the coating and chipping are observed

TABLE 6

Edge Strength/Chipping Resistance, Steel SS1672

| Turning against shoulder: | SS1672 |
| Cutting Speed: | 200 m/min$^{-1}$ |
| Feed: | 0.4 mm/r$^{-1}$ |

TABLE 6-continued

Edge Strength/Chipping Resistance, Steel SS1672

| | |
|---|---|
| Depth of Cut: | 2.0 mm |
| Insert Style: | CNMG 120408-M3 |
| Coolant: | no |

| | Number of Passes | |
|---|---|---|
| Coating | as-coated | wet blasted*) |
| No. 1 | 10 | 50+ |
| No. 2 | 5 | 50+ |
| No. 3 | 5 | 40 |
| No. 4 | 5 | 15 |
| No. 5 | 5 | 10 |

*)note: SEM was used to select inserts exhibiting no TiN flaking at the cutting edges for the test

TABLE 7

Tool Life, Steel SS1672
(Wet Blasted)

| | |
|---|---|
| Turning: | SS1672 |
| Cutting Speed: | 250, 310, 375 m/min |
| Feed: | 0.25 mm/r |
| Depth of Cut: | 2.5 mm |
| Insert Style: | CNMG 120408-M3 |
| Coolant: | no |

| Coating Structure | Cutting Speed | Average Lifetime | Δt/% |
|---|---|---|---|
| No. 6 | 375 m/min | 3 min | — |
| No. 7 | 375 m/min | 5 min*) | +67% |
| No. 3 | 375 m/min | 9 min*) | +200% |
| No. 6 | 310 m/min | 5 min | — |
| No. 7 | 310 m/min | 7 min*) | +40% |
| No. 3 | 310 m/min | 11 min* | +120% |
| No. 6 | 250 m/min | 18 min | — |
| No. 7 | 250 m/min | 20 min | +11% |
| No. 3 | 250 m/min | 22 min | +22% |

*)note: alumina coated inserts showed less plastic deformation at higher cutting speeds

TABLE 8

| | Blasting Response | | |
|---|---|---|---|
| Coating Structure | Toughness (number of passes)*) | Flaking Resistance | Production Yield |
| No. 3 | 40 | — | 80% flaked |
| No. 8 | 40 | — | 45% flaked |
| No. 9 | 40 | + | 20% flaked |
| No. 10 | 40 | ++ | <2% flaked |

*)note: alumina coated inserts showed less plastic deformation at higher cutting speeds The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A coated cemented carbide body comprising a substrate of a cemented carbide, a layer of $Al_2O_3$ and an outer layer of wet blasted TiN at least 4 μm in thickness, the outer layer comprising a multilayer of TiN/TiC.

2. The coated cemented carbide body of claim 1 wherein the TiN/TiC multilayer is from 4 to 15 μm and comprises 5 to 20 layers.

3. The coated cemented carbide body of claim 1 wherein the $Al_2O_3$ is α-$Al_2O_3$.

4. The coated cemented carbide body of claim 3 wherein there is a bonding layer between the α-$Al_2O_3$ and the outer layer.

5. The coated cemented carbide body of claim 1 wherein the layer of $Al_2O_3$ comprises a layer of α-$Al_2O_3$, a bonding layer and a layer of κ-$Al_2O_3$.

6. The coated cemented carbide body of claim 5 wherein the bonding layer comprises a layer of (Ti,Al)(C,O,N) deposited on said layer of α-$Al_2O_3$ and a layer of TiC deposited on said (Ti,Al)(C,O,N) layer.

7. The coated cemented carbide body of claim 1 wherein the $Al_2O_3$ is thicker >8 μm.

8. The coated cemented carbide body of claim 1 wherein the TiN outer layer is from 4 to 15 μm.

9. The coated cemented carbide body of claim 1 wherein the outer TiN layer is greater than 4 μm.

10. A method of cutting Ca-treated steels using a cemented carbide cutting insert, the improvement comprising using the cutting insert of claim 1.

* * * * *